US009281245B2

(12) United States Patent
Salzman et al.

(10) Patent No.: US 9,281,245 B2
(45) Date of Patent: Mar. 8, 2016

(54) LATCHUP REDUCTION BY GROWN ORTHOGONAL SUBSTRATES

(71) Applicant: Texas Instruments Incorporated, Dallas, TX (US)

(72) Inventors: James Fred Salzman, Anna, TX (US); Charles Clayton Hadsell, Farmers Branch, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 63 days.

(21) Appl. No.: 14/101,451

(22) Filed: Dec. 10, 2013

(65) Prior Publication Data

US 2014/0183707 A1 Jul. 3, 2014

Related U.S. Application Data

(60) Provisional application No. 61/746,968, filed on Dec. 28, 2012.

(51) Int. Cl.
| | |
|---|---|
| *H01L 21/02* | (2006.01) |
| *H01L 27/02* | (2006.01) |
| *H01L 21/82* | (2006.01) |
| *H01L 21/74* | (2006.01) |
| *H01L 27/092* | (2006.01) |
| *H01L 29/78* | (2006.01) |

(52) U.S. Cl.
CPC ............ *H01L 21/82* (2013.01); *H01L 21/74* (2013.01); *H01L 27/0921* (2013.01); *H01L 29/78* (2013.01)

(58) Field of Classification Search
CPC .......................... H01L 21/0257; H01L 21/74
See application file for complete search history.

(56) References Cited

U.S. PATENT DOCUMENTS

| | | | | | |
|---|---|---|---|---|---|
| 4,475,280 | A | * | 10/1984 | Ragonese et al. | 438/324 |
| 4,994,887 | A | * | 2/1991 | Hutter et al. | 257/370 |
| 5,017,995 | A | * | 5/1991 | Soejima | 257/370 |
| 5,121,185 | A | * | 6/1992 | Tamba et al. | 257/553 |
| 5,256,582 | A | * | 10/1993 | Mosher | H01L 27/0623 148/DIG. 9 |
| 5,565,701 | A | * | 10/1996 | Zambrano | 257/500 |
| 5,574,621 | A | * | 11/1996 | Sakamoto et al. | 361/321.1 |
| 5,889,315 | A | * | 3/1999 | Farrenkopf et al. | 257/552 |

* cited by examiner

Primary Examiner — Lex Malsawma
(74) Attorney, Agent, or Firm — Gregory J. Albin; Frank D. Cimino (57) ABSTRACT

An integrated circuit is formed by providing a heavily doped substrate of a first conductivity type, forming a lightly doped lower epitaxial layer of the first conductivity type over the substrate, implanting dopants of the first conductivity type into the lower epitaxial layer in an area for a shallow component and blocking the dopants from an area for a deep component, forming a lightly doped upper epitaxial layer over the lower epitaxial layer and activating the implanted dopants to form a heavily doped region. The shallow component is formed over the heavily doped region, and the deep component is formed outside the heavily doped region, extending through the upper epitaxial layer into the lower epitaxial layer.

20 Claims, 9 Drawing Sheets

LATCHUP REDUCTION BY GROWN ORTHOGONAL SUBSTRATES

CROSS-REFERENCE TO RELATED APPLICATIONS

This application claims the benefit of priority under U.S.C. §119(e) of U.S. Provisional Application 61/746,968 filed Dec. 28, 2012, which is hereby incorporated by reference in its entirety.

FIELD OF THE INVENTION

This invention relates to the field of integrated circuits. More particularly, this invention relates to epitaxial layers in integrated circuits.

BACKGROUND OF THE INVENTION

An integrated circuit includes components such as metal oxide semiconductor (MOS) transistors with wells and doped regions that act as coupled bipolar transistors, and so be susceptible to latchup. During a latchup condition, the coupled bipolar transistors conduct large currents, interfering with operation of the integrated circuit. Latchup is triggered by current flow below the components which cause lateral voltage gradients which turn on the coupled bipolar transistors. One approach to reducing susceptibility to latchup is to provide a heavily doped substrate with a lightly doped epitaxial layer and forming the components in the epitaxial layer. The thickness of the epitaxial layer is selected so that the heavily doped substrate is close enough to the components to shunt the current flow below the components, reducing the lateral voltage gradients, while being separated enough to reduce effects on performance of the components.

The integrated circuit includes other components such as low voltage MOS transistors which do not extend close to the substrate. Thus, the substrate is too far removed from these components to reduce latchup susceptibility to a desired level. Decreasing the thickness of the epitaxial layer to reduce latchup susceptibility in the shallow components causes performance degradation in deeper components.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit is formed by providing a heavily doped substrate of a first conductivity type, forming a lightly doped lower epitaxial layer of the first conductivity type over the substrate, implanting dopants of the first conductivity type into the lower epitaxial layer in an area for a shallow component and blocking the dopants from an area for a deep component, forming a lightly doped upper epitaxial layer over the lower epitaxial layer and activating the implanted dopants to form a heavily doped region. The shallow component is formed over the heavily doped region, and the deep component is formed outside the heavily doped region, extending through the upper epitaxial layer into the lower epitaxial layer.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit is formed by providing a heavily doped substrate of a first conductivity type, forming a lightly doped lower epitaxial layer of the first conductivity type over the substrate, implanting dopants of the first conductivity type into the lower epitaxial layer in an area for a shallow component and blocking the dopants from an area for a deep component, forming a lightly doped upper epitaxial layer over the lower epitaxial layer and activating the implanted dopants to form a heavily doped region. The shallow component is formed over the heavily doped region, and the deep component is formed outside the heavily doped region, extending through the upper epitaxial layer into the lower epitaxial layer.

The integrated circuit may include additional epitaxial layers and additional heavily doped regions to accommodate components of several depths. A substrate tap structure may be formed in a portion of the heavily doped region. A portion of the heavily doped region may surround an area of the integrated circuit to provide isolation.

The examples disclosed herein will be described with p-type substrates and epitaxial layers. Analogous examples with n-type substrates and epitaxial layers may be obtained by appropriate changes of dopant polarity.

Figure 1:
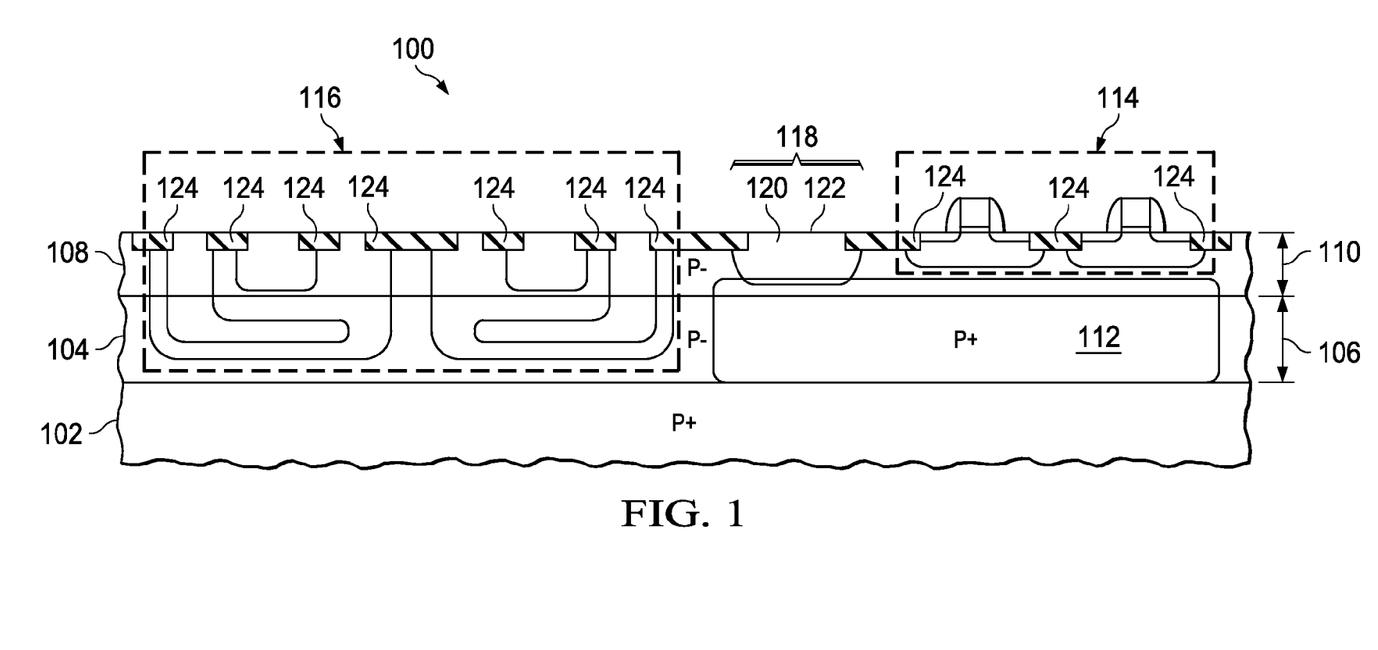
FIG. 1 is a cross section of an example integrated circuit.

FIG. 1 is a cross section of an example integrated circuit. The integrated circuit 100 is formed on a heavily doped p-type substrate 102. A bulk resistivity of the substrate 102 is less than 1 ohm-cm and may be 0.001 ohm-cm to 0.01 ohm-cm. The substrate 102 may be a single crystal silicon wafer or other substrate appropriate for formation of the integrated circuit 100. A lightly doped p-type lower epitaxial layer 104 is disposed over the substrate 102. A thickness 106 of the lower epitaxial layer 104 may be 1 micron to 15 microns. A bulk resistivity of the lower epitaxial layer 104 is above 1 ohm-cm, and may be 10 ohm-cm to 100 ohm-cm. A lightly doped p-type upper epitaxial layer 108 is disposed over the lower epitaxial layer 104. A thickness 110 of the upper epitaxial layer 108 may be 1 micron to 3 microns. A bulk resistivity of the upper epitaxial layer 108 is above 1 ohm-cm, and may be 10 ohm-cm to 100 ohm-cm.

A p-type heavily doped region 112 is disposed in the lower epitaxial layer 104 under shallow components 114. The heavily doped region 112 extends at least up to a top of the lower epitaxial layer 104, and may extend into the upper epitaxial layer 108. The heavily doped region 112 extends at least down to a bottom of the lower epitaxial layer 104, and possibly into the substrate 102. A bulk resistivity of the heavily doped region 112 is less than 1 ohm-cm, and may be 0.01 ohm-cm to 0.05 ohm-cm. The shallow components 114, depicted in FIG. 1 as low voltage MOS transistors 114, are disposed above the heavily doped region 112. Deep components 116, depicted in FIG. 1 as bipolar transistors 116 are disposed in the upper epitaxial layer 108 and the lower epitaxial layer 104. The deep components 116 are located outside of the heavily doped region 112. The substrate 102 may reduce latchup in circuits containing the deep components 116 by providing a low resistance region proximate to a bottom of the deep components 116. The heavily doped region 112 may advantageously reduce latchup in circuits containing the shallow components 114 by providing a low resistance region proximate to a bottom of the shallow components 114.

A substrate tap structure 118 includes a p-type heavily doped well 120 in the upper epitaxial layer 108 over a portion of the heavily doped region 112. The heavily doped well 120 has an average doping density greater than $1\times10^{18}$ cm$^{-3}$. The substrate tap structure 118 advantageously provides a low resistance vertical path from a top surface 122 of the upper epitaxial layer 108 through the heavily doped well 120 and the heavily doped region 112 to the substrate 102. The substrate tap structure 118 may be used to provide top surface contacts to the substrate 102, eliminating bottom surface contacts and thus simplifying a fabrication sequence and reducing a fabrication cost of the integrated circuit 100. Field oxide 124 may be formed at the top surface 122 of the upper epitaxial layer 108 to laterally isolate components and structures in the integrated circuit 100.

Figure 2A:
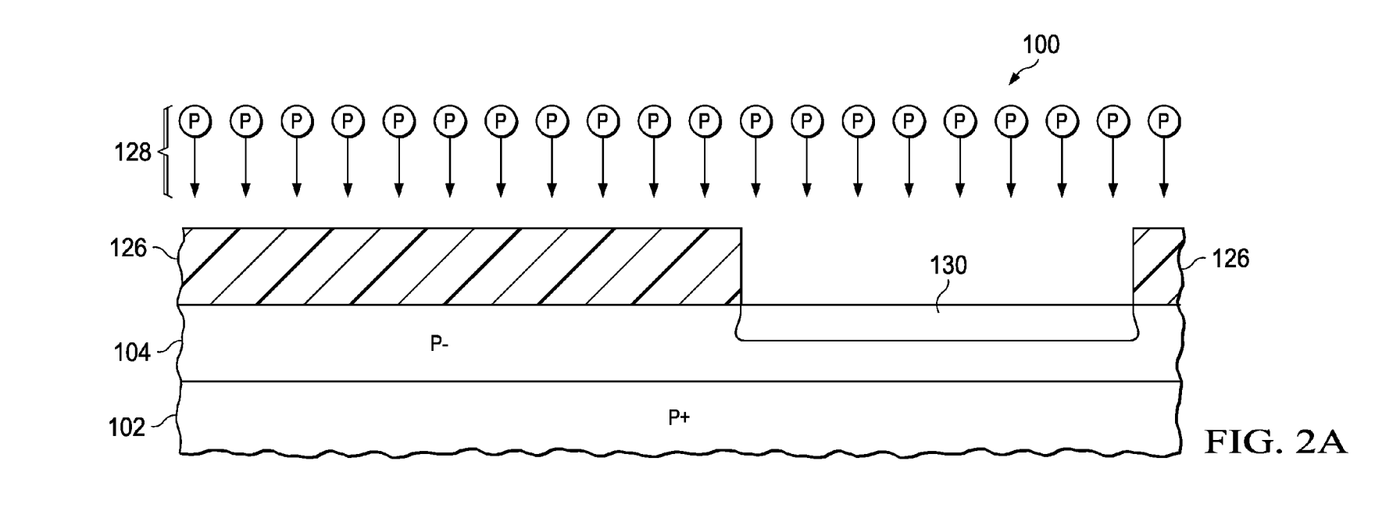
FIG. 2A through FIG. 2D are cross sections of the integrated circuit of FIG. 1, depicted in successive stages of fabrication.

FIG. 2A through FIG. 2D are cross sections of the integrated circuit of FIG. 1, depicted in successive stages of fabrication. Referring to FIG. 2A, the integrated circuit 100 starts with the heavily doped p-type substrate 102. The lower epitaxial layer 104 is formed over the substrate 102. In the instant example, the lower epitaxial layer 104 may be formed directly on the substrate 102. The lower epitaxial layer 104 may be formed by a silicon epitaxy process including thermal decomposition of dichlorosilane at 900° C. to 1100° C. The lower epitaxial layer 104 may be doped with boron during the epitaxy process or may be doped later by ion implantation.

An implant mask 126 is formed over the lower epitaxial layer 104 which exposes an area for the heavily doped region 112 of FIG. 1, and covers an area for the deep components 116 of FIG. 1. The implant mask 126 may include primarily photoresist, or may include hard mask material such as silicon dioxide and/or silicon nitride. P-type dopants 128 such as boron are implanted into the lower epitaxial layer 104 in the areas exposed by the implant mask 126 to form a heavily implanted region 130 in the lower epitaxial layer 104. The p-type dopants 128 are substantially blocked from the area for the deep components 116 by the implant mask 126. A dose of the p-type dopants 128 may be $1\times10^{14}$ cm$^{-2}$ to $1\times10^{16}$ cm$^{-2}$ so as to provide a bulk resistivity of 0.01 ohm-cm to 0.1 ohm-cm in the heavily doped region 112. The p-type dopants 128 may be implanted in two or more doses at a different energy for each dose, a process referred to as a chained implant process, so as to spread out the implanted p-type dopants 128 in the heavily implanted region 130. The chained implant process may be useful if the lower epitaxial layer 104 is more than 5 microns thick.

A layer of pad oxide, not shown in FIG. 2A, may be formed over the lower epitaxial layer 104 before the p-type dopants 128 are implanted to protect the lower epitaxial layer 104. The implant mask 126 is removed after the p-type dopants 128 are implanted. Any pad oxide is also removed before subsequent epitaxial growth processes.

Figure 2B:
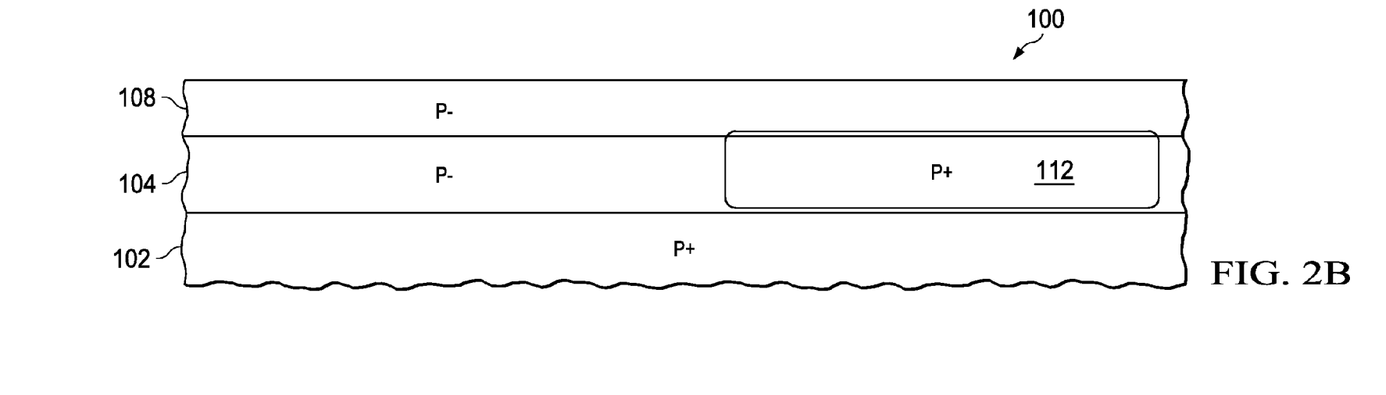

Referring to FIG. 2B, the upper epitaxial layer 108 is formed over the lower epitaxial layer 104. In the instant example, the upper epitaxial layer 108 may be formed directly on the lower epitaxial layer 104. The upper epitaxial layer 108 may be doped with boron during the epitaxy process or may be doped later by ion implantation. The epitaxial growth process which forms the upper epitaxial layer 108 causes the implanted p-type dopants in the heavily implanted region 130 of FIG. 2A to diffuse and partially activate so as to form the heavily doped region 112. The heavily doped region 112 may expand upward into the upper epitaxial layer 108 during the epitaxial growth process, as depicted in FIG. 2B.

Figure 2C:
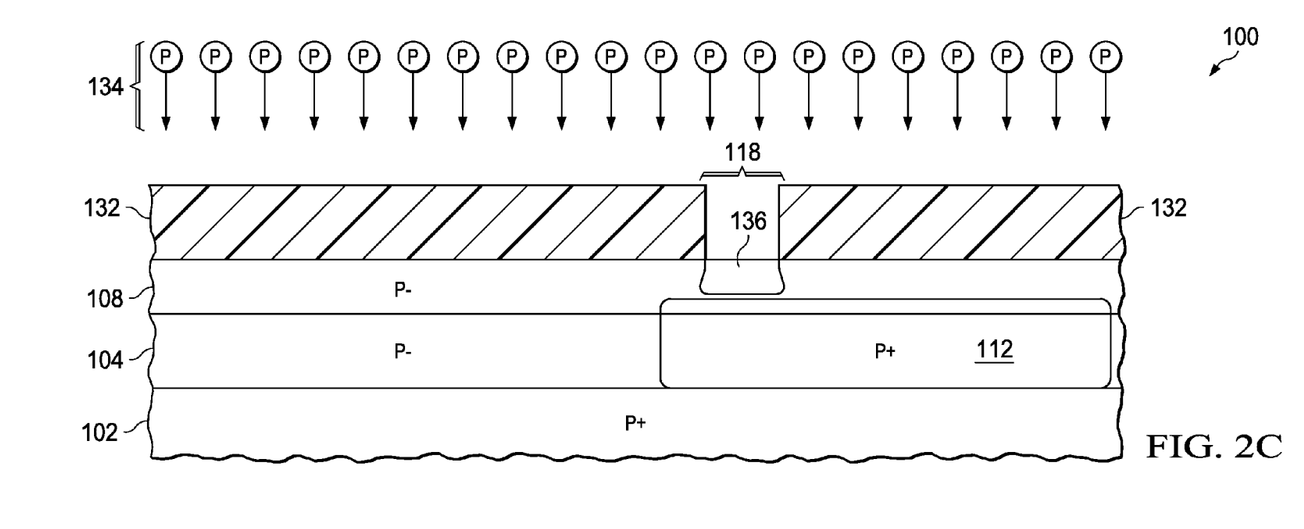

Referring to FIG. 2C, a thermal anneal is performed which further diffuses and activates the implanted p-type dopants in the heavily doped region 112. An implant mask 132 is formed over the upper epitaxial layer 108 which exposes an area for the heavily doped well 120 of FIG. 1 of the substrate tap structure 118. The implant mask 132 may include primarily photoresist. P-type dopants 134 such as boron are implanted into the upper epitaxial layer 108 in the areas exposed by the implant mask 132 to form a tap implanted region 136 in the upper epitaxial layer 108. A dose of the p-type dopants 134 may be, for example, $1\times10^{13}$ cm$^{-2}$ to $1\times10^{16}$ cm$^{-2}$. A layer of pad oxide, not shown in FIG. 2C, may be formed over the upper epitaxial layer 108 before the p-type dopants 134 are implanted. The implant mask 132 is removed after the p-type dopants 134 are implanted.

Figure 2D:
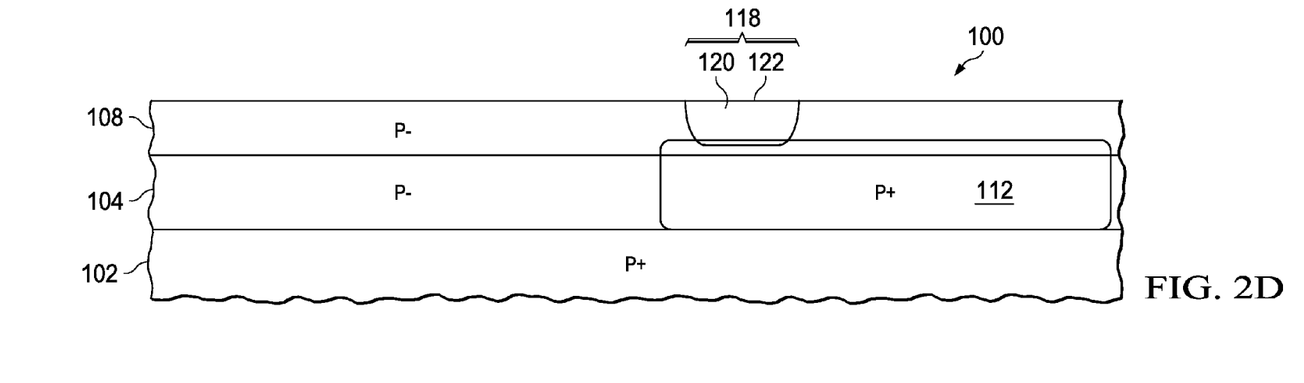

Referring to FIG. 2D, a thermal anneal is performed which diffuses and activates the implanted p-type dopants in the tap implanted region 136 of FIG. 2C to form the heavily doped well 120 of the substrate tap structure 118. Subsequent processing forms the deep components 116 and the shallow components 114 to provide the structure of FIG. 1.

Figure 3:
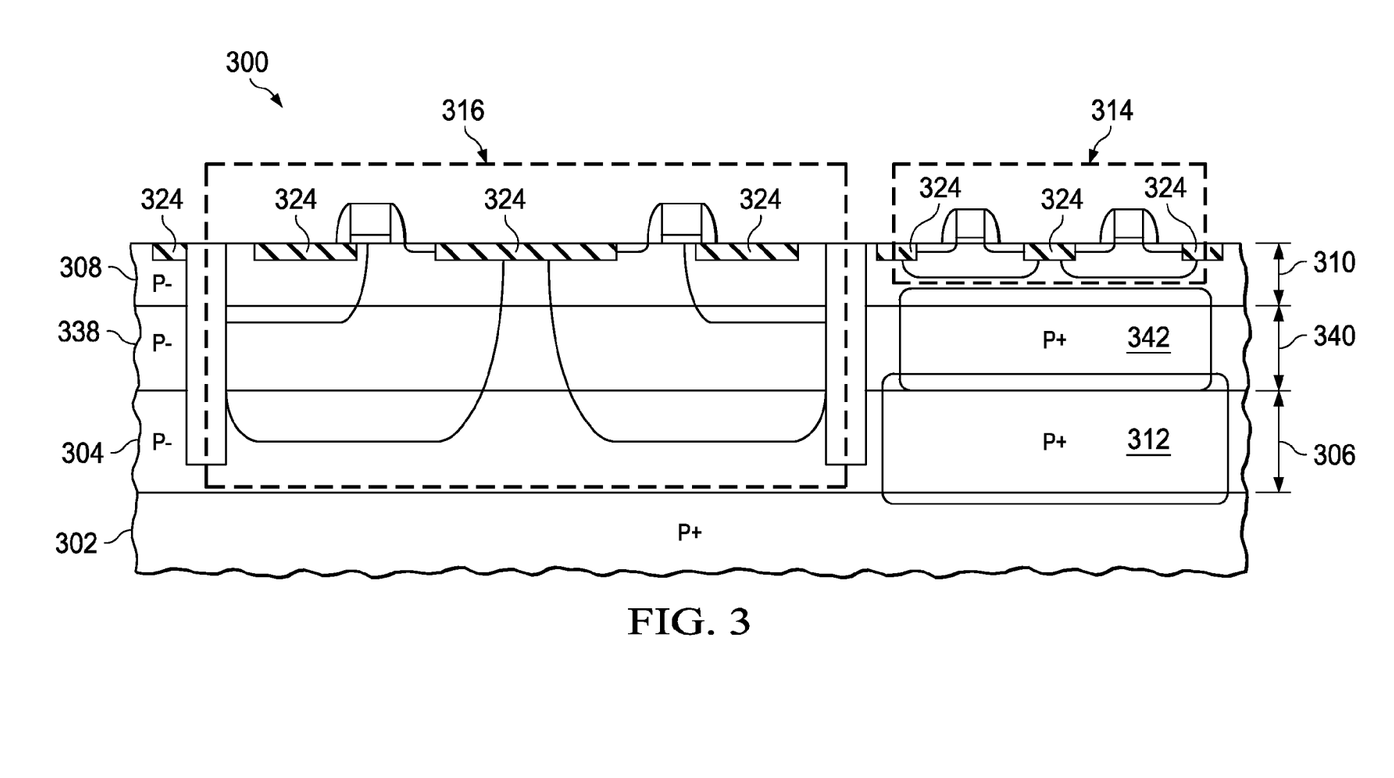
FIG. 3 is a cross section of another example integrated circuit.

FIG. 3 is a cross section of another example integrated circuit. The integrated circuit 300 is formed on a heavily doped p-type substrate 302 as described in reference to FIG. 1. A bulk resistivity of the substrate 302 is less than 1 ohm-cm. A lightly doped p-type lower epitaxial layer 304 is disposed over the substrate 302. A thickness 306 of the lower epitaxial layer 304 may be 1 micron to 5 microns. A bulk resistivity of the lower epitaxial layer 304 is above 1 ohm-cm, and may be 10 ohm-cm to 100 ohm-cm.

A lightly doped p-type middle epitaxial layer 338 is disposed over the lower epitaxial layer 304. A thickness 340 of the middle epitaxial layer 338 may be 1 micron to 5 microns. A bulk resistivity of the middle epitaxial layer 338 is above 1 ohm-cm, and may be 10 ohm-cm to 100 ohm-cm.

A lightly doped p-type upper epitaxial layer 308 is disposed over the middle epitaxial layer 338. A thickness 310 of the upper epitaxial layer 308 may be 1 micron to 3 microns. A bulk resistivity of the upper epitaxial layer 308 is above 1 ohm-cm, and may be 10 ohm-cm to 100 ohm-cm.

A p-type first heavily doped region 312 is disposed in the lower epitaxial layer 304 under shallow components 314. The first heavily doped region 312 extends at least up to a top of the lower epitaxial layer 304, and possibly into the middle epitaxial layer 338. The first heavily doped region 312 extends at least down to a bottom of the lower epitaxial layer 304, and possibly into the substrate 302. A bulk resistivity of the first heavily doped region 312 is less than 1 ohm-cm, and may be 0.1 ohm-cm to 0.01 ohm-cm.

A p-type second heavily doped region 342 is disposed in the middle epitaxial layer 338 under the shallow components 314. The second heavily doped region 342 extends at least up to a top of the middle epitaxial layer 338, and possibly into the upper epitaxial layer 308. The second heavily doped region 342 extends at least down to a bottom of the middle epitaxial layer 338, and possibly into the lower epitaxial layer 304. A bulk resistivity of the second heavily doped region 342 is less than 1 ohm-cm, and may be 0.1 ohm-cm to 0.01 ohm-cm.

The shallow components 314, depicted in FIG. 3 as low voltage MOS transistors 314, are disposed above the second heavily doped region 342. Deep components 316, depicted in FIG. 3 as high voltage MOS transistors 316, are disposed in the upper epitaxial layer 308, the middle epitaxial layer 338 and the lower epitaxial layer 304. The deep components 316 are located outside of the first heavily doped region 312 and the second heavily doped region 342. Field oxide 324 may be formed at the top surface 322 of the upper epitaxial layer 308 to laterally isolate components and structures in the integrated circuit 300. The substrate 302 may reduce latchup in circuits containing the deep components 316 by providing a low resistance region proximate to a bottom of the deep components 316. The first heavily doped region 312 combined with the second heavily doped region 342 may advantageously reduce latchup in circuits containing the shallow components 314 by providing a low resistance region proximate to a bottom of the shallow components 314.

Figure 4A:
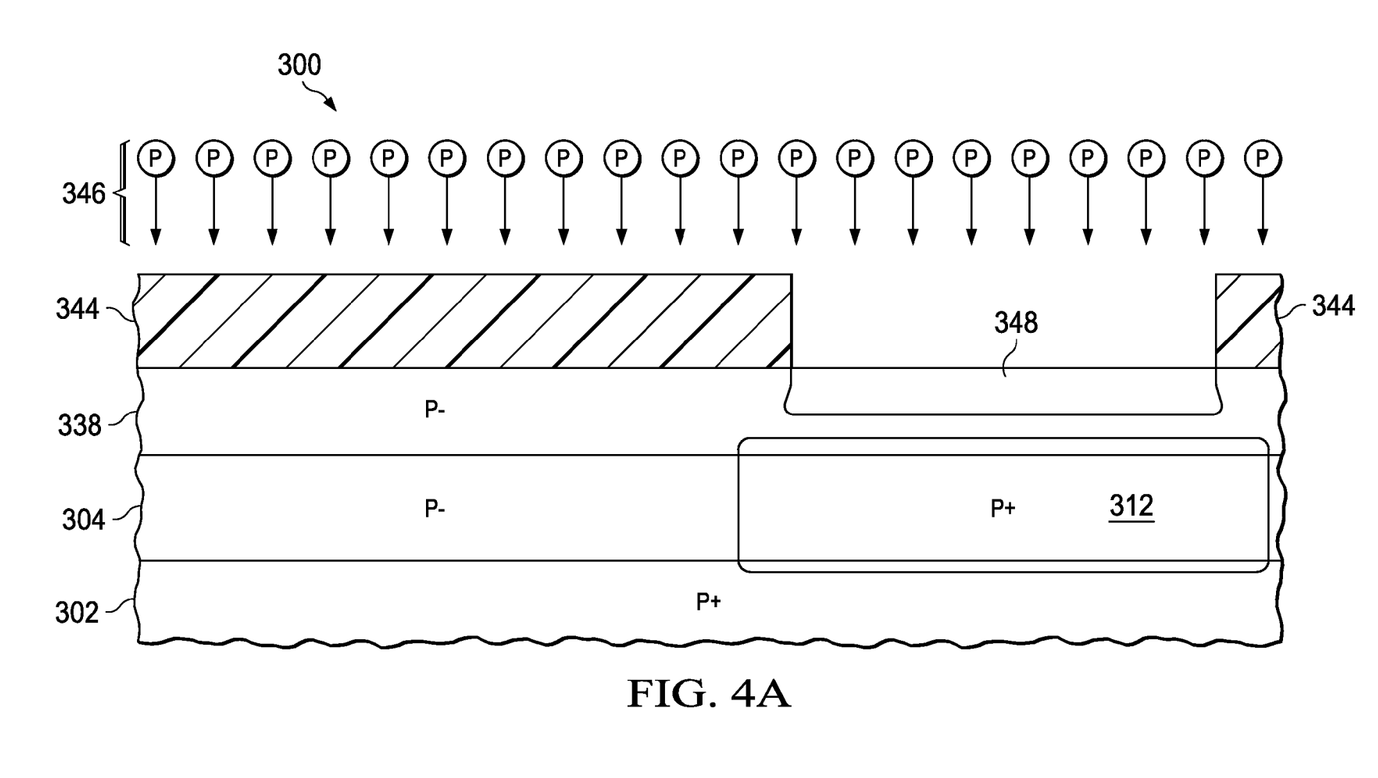
FIG. 4A and FIG. 4B are cross sections of the integrated circuit of FIG. 3, depicted at key stages of fabrication.

FIG. 4A and FIG. 4B are cross sections of the integrated circuit of FIG. 3, depicted at key stages of fabrication. Referring to FIG. 4A, the integrated circuit 300 starts with the p-type heavily doped substrate 302. The lower epitaxial layer 304 is formed over the substrate 302. In the instant example, the lower epitaxial layer 304 may be formed directly on the substrate 302. The lower epitaxial layer 304 may be doped with boron during the epitaxy process or may be doped later by ion implantation. The first heavily doped region 312 is formed in the lower epitaxial layer 304, for example as described in reference to FIG. 2A through FIG. 2C. The middle epitaxial layer 338 is formed over, possibly directly on, the lower epitaxial layer 304. The middle epitaxial layer 338 may be doped with boron during the epitaxy process or may be doped later by ion implantation.

An implant mask 344 is formed over the middle epitaxial layer 338 which exposes an area for the second heavily doped region 342 of FIG. 3. The implant mask 344 may include primarily photoresist, or may include hard mask material such as silicon dioxide and/or silicon nitride. P-type dopants 346 such as boron are implanted into the middle epitaxial layer 338 in the areas exposed by the implant mask 344 to form a heavily implanted region 348 in the middle epitaxial layer 338. The p-type dopants 346 are substantially blocked from the area for the deep components 316 by the implant mask 344. A dose of the p-type dopants 346 may be $1 \times 10^{14}$ cm$^{-2}$ to $1 \times 10^{16}$ cm$^{-2}$ so as to provide a bulk resistivity of 0.01 ohm-cm to 1 ohm-cm in the second heavily doped region 342. A layer of pad oxide, not shown in FIG. 4A, may be formed over the middle epitaxial layer 334 before the p-type dopants 346 are implanted. The implant mask 344 is removed after the p-type dopants 346 are implanted. Any pad oxide is also removed before subsequent epitaxial growth processes.

Figure 4B:
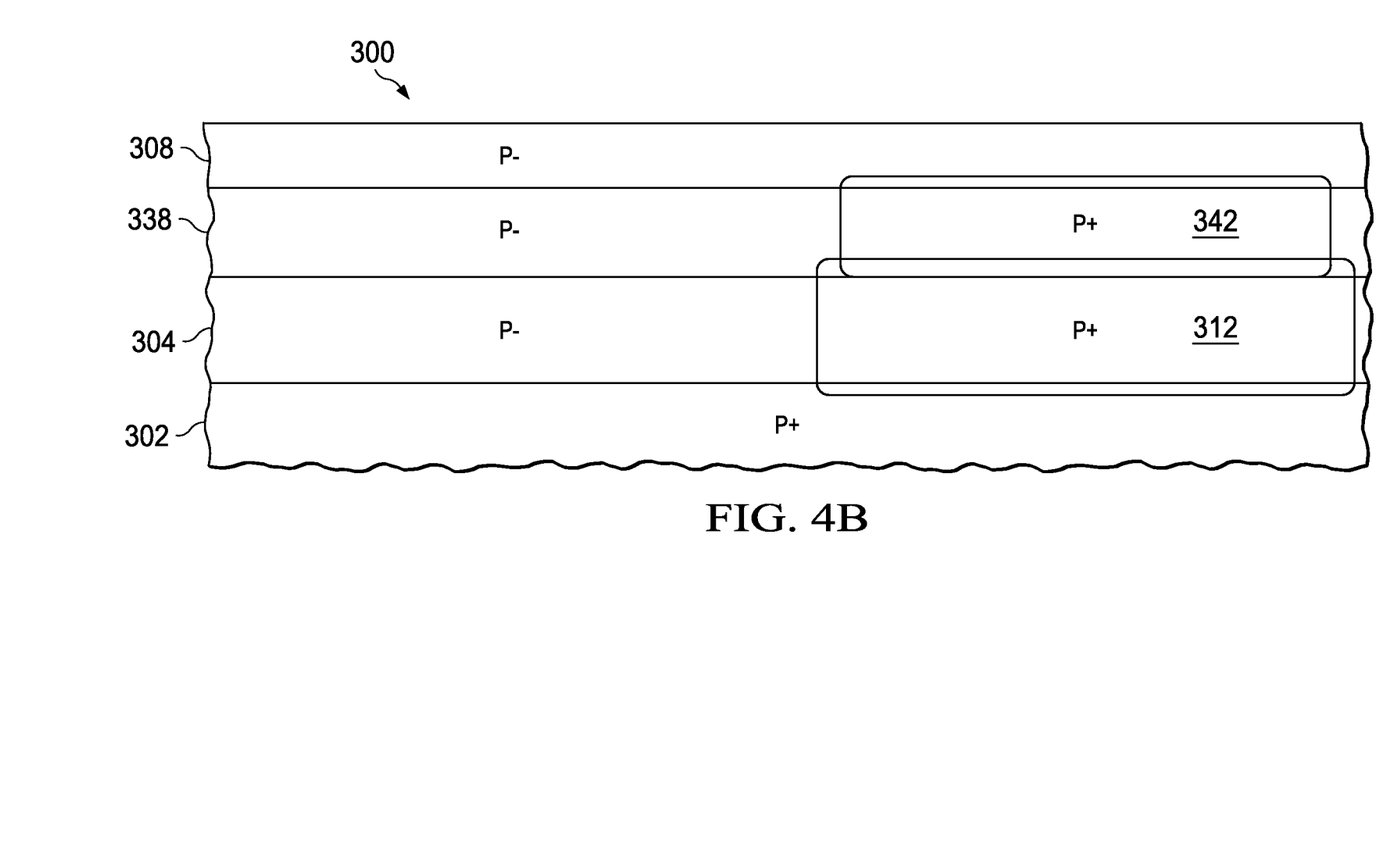

Referring to FIG. 4B, the upper epitaxial layer 308 is formed over, possibly directly on, the middle epitaxial layer 338. The upper epitaxial layer 308 may be doped with boron during the epitaxy process or may be doped later by ion implantation. The epitaxial growth process which forms the upper epitaxial layer 308 causes the implanted p-type dopants in the heavily implanted region 348 of FIG. 4A to diffuse and partially activate so as to form the second heavily doped region 342. The second heavily doped region 342 may expand upward into the upper epitaxial layer 308 and downward into the first heavily doped region 312 during the epitaxial growth process, as depicted in FIG. 4B. A thermal anneal may be subsequently performed which further diffuses and activates the implanted p-type dopants in the second heavily doped region 342. Subsequent processing forms the deep components 316 and the shallow components 314 to provide the structure of FIG. 3.

Figure 5:
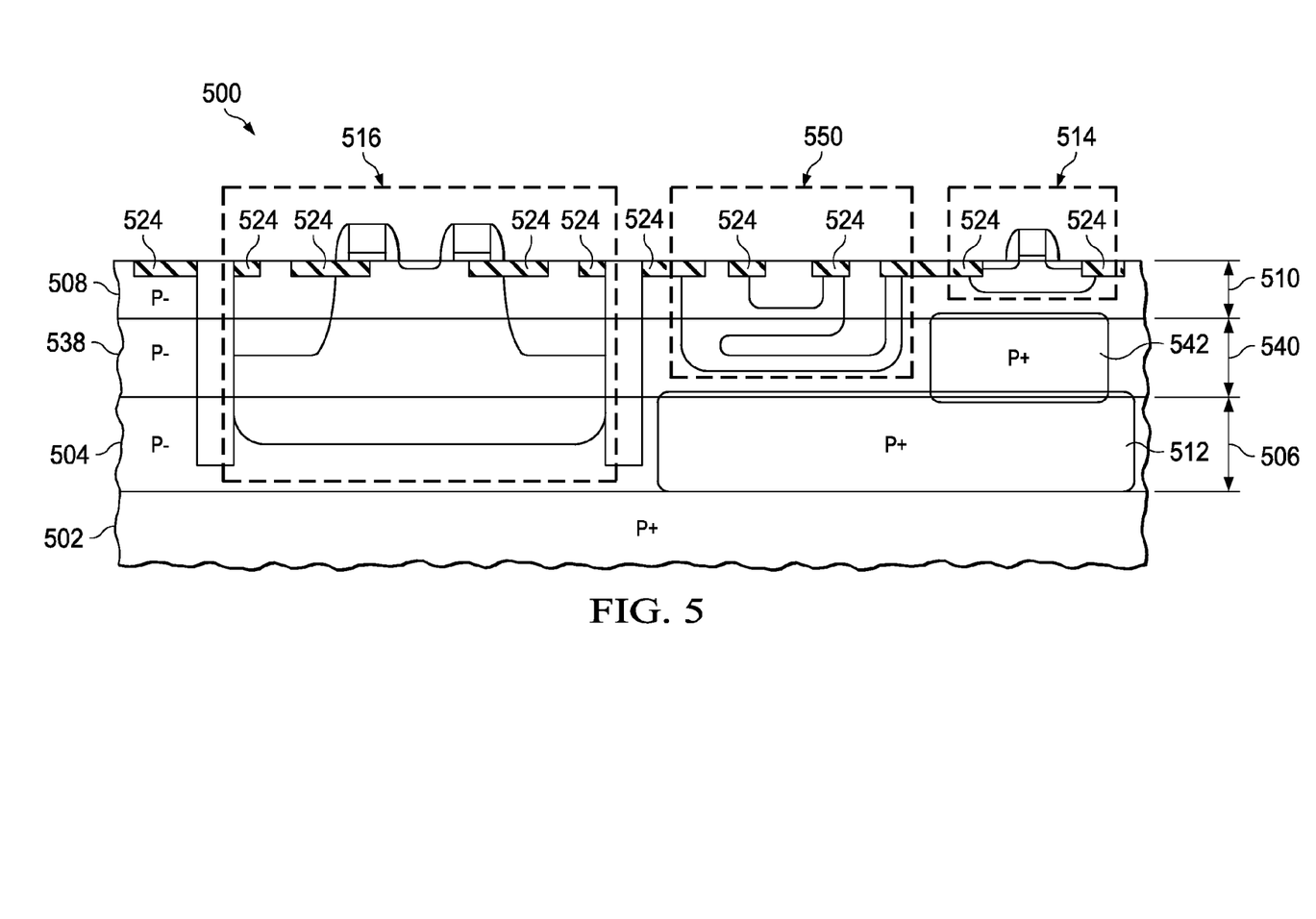
FIG. 5 is a cross section of a further example integrated circuit.

FIG. 5 is a cross section of a further example integrated circuit. The integrated circuit 500 is formed on a heavily doped p-type substrate 502 as described in reference to FIG. 1. A bulk resistivity of the substrate 502 is less than 1 ohm-cm. A lightly doped p-type lower epitaxial layer 504 is disposed over the substrate 502. A thickness 506 of the lower epitaxial layer 504 may be 1 micron to 5 microns. A bulk resistivity of the lower epitaxial layer 504 is above 1 ohm-cm, and may be 10 ohm-cm to 100 ohm-cm. A lightly doped p-type middle epitaxial layer 538 is disposed over, possibly directly on, the lower epitaxial layer 504. A thickness 540 of the middle epitaxial layer 538 may be 1 micron to 5 microns. A bulk resistivity of the middle epitaxial layer 538 is above 1 ohm-cm, and may be 10 ohm-cm to 100 ohm-cm. A lightly doped p-type upper epitaxial layer 508 is disposed over, possibly directly on, the middle epitaxial layer 538. A thickness 510 of the upper epitaxial layer 508 may be 1 micron to 3 microns. A bulk resistivity of the upper epitaxial layer 508 is above 1 ohm-cm, and may be 10 ohm-cm to 100 ohm-cm.

A p-type first heavily doped region 512 is disposed in the lower epitaxial layer 504 under shallow components 514 and under intermediate components 550. The shallow components 514 are represented in FIG. 5 by a low voltage MOS transistor 514; the intermediate components 550 are represented by a bipolar transistor 550. The first heavily doped region 512 extends at least up to a top of the lower epitaxial layer 504, and possibly into the middle epitaxial layer 538, and at least down to a bottom of the lower epitaxial layer 504, and possibly into the substrate 502. A bulk resistivity of the first heavily doped region 512 is less than 1 ohm-cm. The first heavily doped region 512 may be formed, for example, as described in reference to FIG. 2A through FIG. 2C.

A p-type second heavily doped region 542 is disposed in the middle epitaxial layer 538 under the shallow components 514, but not under the intermediate components 550. The second heavily doped region 542 extends at least up to a top of the middle epitaxial layer 538, and possibly into the upper epitaxial layer 508, and at least down to a bottom of the middle epitaxial layer 538, and possibly into the first heavily doped region 512. The second heavily doped region 542 may extend into the lower epitaxial layer 504. A bulk resistivity of the second heavily doped region 542 is less than 1 ohm-cm. The second heavily doped region 542 may be formed, for example, as described in reference to FIG. 4A and FIG. 4B.

The shallow components 514 are disposed above the second heavily doped region 542. The intermediate components 550 are disposed above the first heavily doped region 512, and are outside of the second heavily doped region 542. Deep components 516, represented in FIG. 5 as a high voltage MOS transistor 516, are disposed in the upper epitaxial layer 508, the middle epitaxial layer 538 and the lower epitaxial layer 504. The deep components 516 are located outside of the first heavily doped region 512 and the second heavily doped region 542. Field oxide 524 may be formed at the top surface 522 of the upper epitaxial layer 508 to laterally isolate components and structures in the integrated circuit 500. The substrate 502 may reduce latchup in circuits containing the deep components 516 by providing a low resistance region proximate to a bottom of the deep components 516. The first heavily doped region 512 combined with the second heavily doped region 542 may advantageously reduce latchup in circuits containing the shallow components 514 by providing a low resistance region proximate to a bottom of the shallow components 514. The first heavily doped region 512 may advantageously reduce latchup in circuits containing the intermediate components 550 by providing a low resistance region proximate to a bottom of the intermediate components 550.

Figure 6:
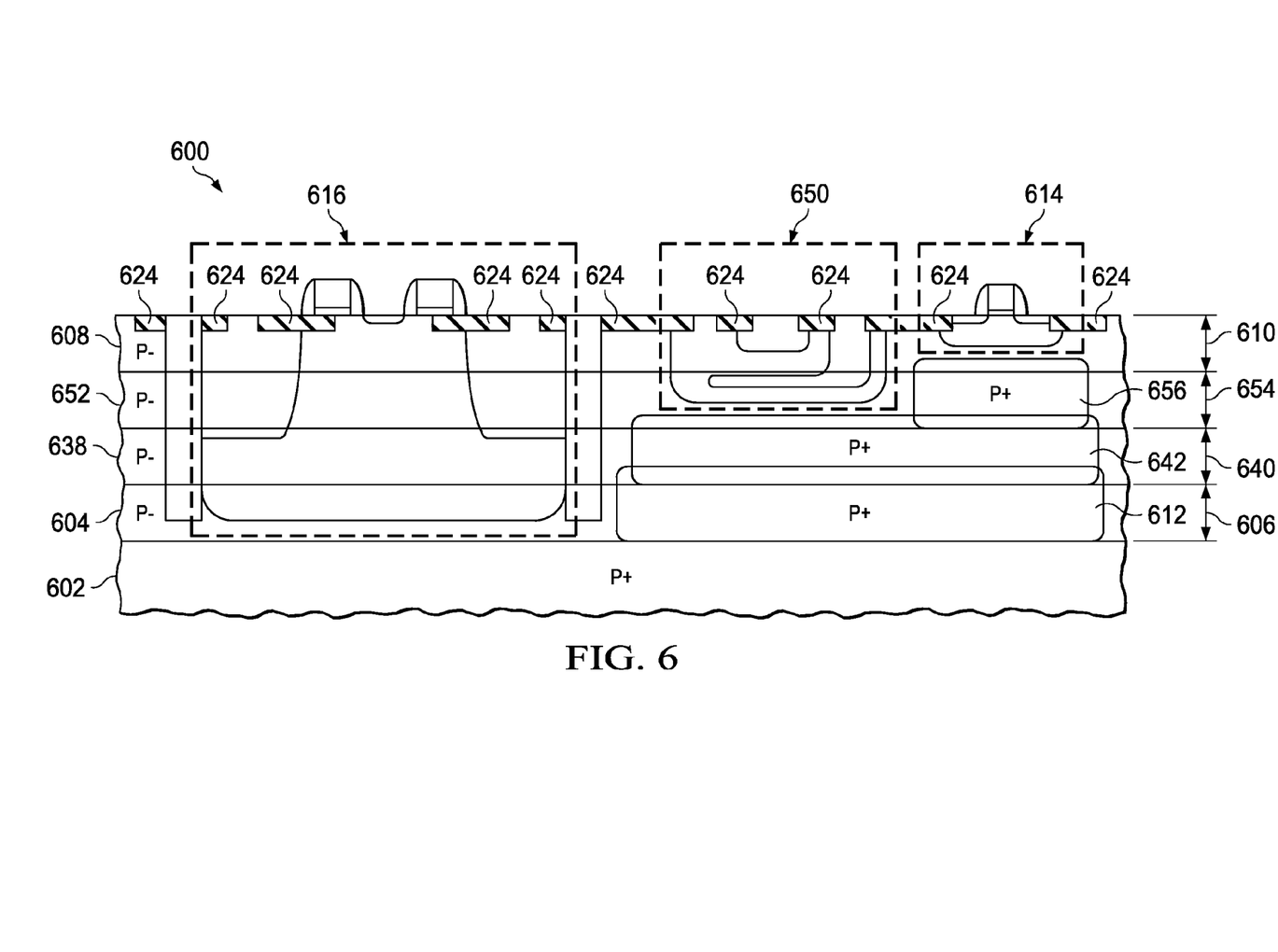
FIG. 6 is a cross section of yet another example integrated circuit.

FIG. 6 is a cross section of yet another example integrated circuit. The integrated circuit 600 is formed on a heavily doped p-type substrate 602 as described in reference to FIG. 1. A bulk resistivity of the substrate 602 is less than 1 ohm-cm. A lightly doped p-type lower epitaxial layer 604 is disposed over the substrate 602. A thickness 606 of the lower epitaxial layer 604 may be 1 micron to 5 microns. A bulk resistivity of the lower epitaxial layer 604 is above 1 ohm-cm, and may be 10 ohm-cm to 100 ohm-cm. A lightly doped p-type first middle epitaxial layer 638 is disposed over, possibly directly on, the lower epitaxial layer 604. A thickness 640 of the first middle epitaxial layer 638 may be 1 micron to 5 microns. A bulk resistivity of the first middle epitaxial layer 638 is above 1 ohm-cm, and may be 10 ohm-cm to 100 ohm-cm. A lightly doped p-type second middle epitaxial layer 652 is disposed over, possibly directly on, the first middle epitaxial layer 638. A thickness 654 of the second middle epitaxial layer 652 may be 1 micron to 5 microns. A bulk resistivity of the second middle epitaxial layer 652 is above 1 ohm-cm, and may be 10 ohm-cm to 100 ohm-cm. A lightly doped p-type upper epitaxial layer 608 is disposed over, possibly directly on, the second middle epitaxial layer 652. A thickness 610 of the upper epitaxial layer 608 may be 1 micron to 3 microns. A bulk resistivity of the upper epitaxial layer 608 is above 1 ohm-cm, and may be 10 ohm-cm to 100 ohm-cm.

A p-type first heavily doped region 612 is disposed in the lower epitaxial layer 604 under shallow components 614 and under intermediate components 650. The shallow components 614 are represented in FIG. 6 by a low voltage MOS transistor 614; the intermediate components 650 are represented by a bipolar transistor 650. The first heavily doped region 612 extends at least up to a top of the lower epitaxial layer 604, and possibly into the first middle epitaxial layer 638, and at least down to a bottom of the lower epitaxial layer 604, and possibly into the substrate 602. A bulk resistivity of the first heavily doped region 612 is less than 1 ohm-cm. The first heavily doped region 612 may be formed, for example, as described in reference to FIG. 2A through FIG. 2C.

A p-type second heavily doped region 642 is disposed in the first middle epitaxial layer 638 under the shallow components 614 and under the intermediate components 650. The second heavily doped region 642 extends at least up to a top of the first middle epitaxial layer 638, and possibly into the second middle epitaxial layer 652, and at least down to a bottom of the first middle epitaxial layer 638, and possibly into the first heavily doped region 612. The second heavily doped region 642 may extend into the lower epitaxial layer 604. A bulk resistivity of the second heavily doped region 642 is less than 1 ohm-cm. The second heavily doped region 642 may be formed, for example, as described in reference to FIG. 4A and FIG. 4B.

A p-type third heavily doped region 656 is disposed in the second middle epitaxial layer 652 under the shallow components 614, but not under the intermediate components 650. The third heavily doped region 656 extends at least up to a top of the second middle epitaxial layer 652, and possibly into the upper epitaxial layer 608, and at least down to a bottom of the second middle epitaxial layer 652, and possibly into the second heavily doped region 642. The third heavily doped region 656 may extend into the first middle epitaxial layer 638. A bulk resistivity of the third heavily doped region 656 is less than 1 ohm-cm. The third heavily doped region 656 may be formed, for example, as described in reference to FIG. 4A and FIG. 4B.

The shallow components 614 are disposed above the third heavily doped region 656. The intermediate components 650 are disposed above the second heavily doped region 642 and are outside of the third heavily doped region 656. Deep components 616 are disposed in the upper epitaxial layer 608, the second middle epitaxial layer 652, the first middle epitaxial layer 638 and the lower epitaxial layer 604. The deep components 616 are located outside of the first heavily doped region 612, the second heavily doped region 642 and the third heavily doped region 656. Field oxide 624 may be formed at the top surface 622 of the upper epitaxial layer 608 to laterally isolate components and structures in the integrated circuit 600. The substrate 602 may reduce latchup in circuits containing the deep components 616 by providing a low resistance region proximate to a bottom of the deep components 616. The first heavily doped region 612 combined with the second heavily doped region 642 may advantageously reduce latchup in circuits containing the intermediate components 650 by providing a low resistance region proximate to a bottom of the intermediate components 650. A combination of the first heavily doped region 612, the second heavily doped region 642 and the third heavily doped region 656 may advantageously reduce latchup in circuits containing the shallow components 614 by providing a low resistance region proximate to a bottom of the shallow components 614. Forming the first heavily doped region 612 combined with the second heavily doped region 642 to provide the low resistance region proximate to the bottom of the intermediate components 650 may advantageously reduce a size of the integrated circuit 600 compared to a heavily doped region formed in one epitaxial layer.

Figure 7:
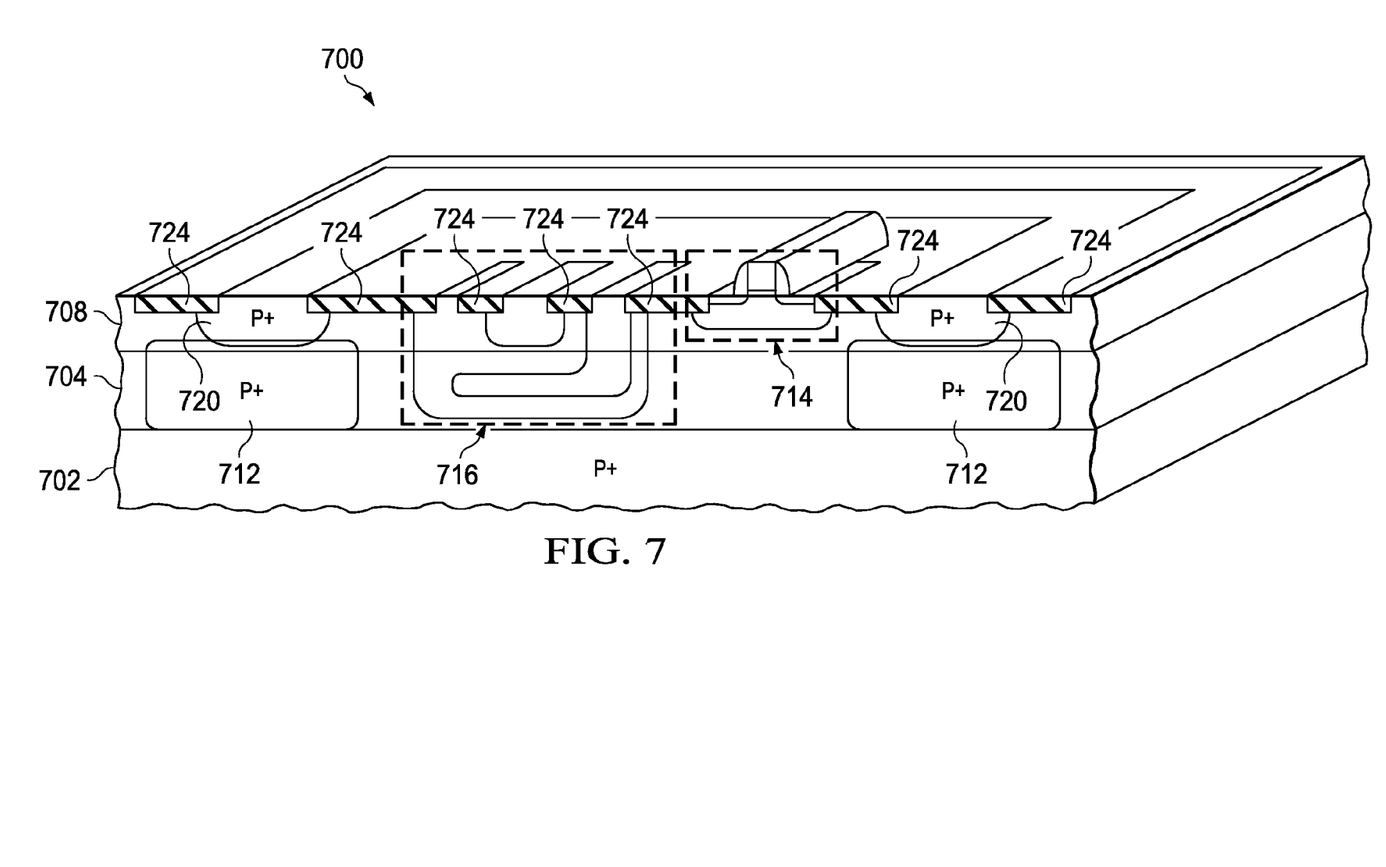
FIG. 7 is a cross section of another example integrated circuit.

FIG. 7 is a cross section of another example integrated circuit. The integrated circuit 700 is formed on a heavily doped p-type substrate 702 as described in reference to FIG. 1. A lightly doped p-type lower epitaxial layer 704 is disposed over the substrate 702. A lightly doped p-type upper epitaxial layer 708 is disposed over the lower epitaxial layer 704. The lower epitaxial layer 704 and the upper epitaxial layer 708 may have properties as described in the examples disclosed herein.

At least one component, represented in FIG. 7 by a shallow component 714 and a deep component 716, is disposed in the upper epitaxial layer 708 and the lower epitaxial layer 704. A p-type heavily doped region 712 is disposed in the lower epitaxial layer 704, so that a portion of the heavily doped region 712 surrounds the at least one component 714 and/or 716. A p-type heavily doped well 720 is disposed in the upper epitaxial layer 708 on the heavily doped region 712 and surrounding the least one component 714 and/or 716. Field oxide 724 may be disposed in the upper epitaxial layer 708. The heavily doped region 712 surrounding the least one component 714 and/or 716 isolates the least one component 714 and/or 716 from other components in the integrated circuit 700. The heavily doped region 712 combined with the heavily doped well 720 surrounding the least one component 714 and/or 716 further isolates the least one component 714 and/or 716. Isolating the least one component 714 and/or 716 may advantageously enable operation of a low noise circuit containing the least one component 714 and/or 716 in an integrated circuit which includes noise generating circuits such as oscillators.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
   a substrate of a first conductivity type, having a bulk resistivity less than 1 ohm-cm;
   a lower epitaxial layer having said first conductivity type disposed over said substrate, said lower conductivity layer having a bulk resistivity above 1 ohm-cm;
   an upper epitaxial layer having said first conductivity type disposed over said lower epitaxial layer, said upper conductivity layer having a bulk resistivity above 1 ohm-cm;
   a doped region having said first conductivity type disposed in said lower epitaxial layer, extending at least up to a top of said lower epitaxial layer and at least down to a bottom of said lower epitaxial layer, said doped region having a bulk resistivity less than 1 ohm-cm;
   a shallow component disposed in said upper epitaxial layer above said doped region; and
   a deep component disposed in said upper epitaxial layer and said lower epitaxial layer, outside of said doped region.

2. The integrated circuit of claim 1, wherein said doped region is a first doped region, and further comprising:
   a middle epitaxial layer having said first conductivity type disposed over said lower epitaxial layer and under said upper epitaxial layer, said middle epitaxial layer having a bulk resistivity above 1 ohm-cm; and
   a second doped region having said first conductivity type disposed in said middle epitaxial layer under said shallow component and over said first doped region, extending at least up to a top of said middle epitaxial layer and at least down to a bottom of said middle epitaxial layer, said second doped region having a bulk resistivity less than 1 ohm-cm, said deep component being disposed outside of said second doped region.

3. The integrated circuit of claim 1, wherein said doped region is a first doped region, and further comprising:
   a middle epitaxial layer having said first conductivity type disposed over said lower epitaxial layer and under said upper epitaxial layer, said middle epitaxial layer having a bulk resistivity above 1 ohm-cm;
   a second doped region having said first conductivity type disposed in said middle epitaxial layer under said shallow component and over a portion of said first doped region, extending at least up to a top of said middle epitaxial layer and at least down to a bottom of said middle epitaxial layer, said second doped region having a bulk resistivity less than 1 ohm-cm, said deep component being disposed outside of said second doped region; and
   an intermediate component disposed in said upper epitaxial layer and said middle epitaxial layer above a portion of said first doped region, said intermediate component being disposed outside of said second doped region.

4. The integrated circuit of claim 1, wherein said doped region is a first doped region, and further comprising:
   a first middle epitaxial layer having said first conductivity type disposed over said lower epitaxial layer, said first middle epitaxial layer having a bulk resistivity above 1 ohm-cm;
   a second middle epitaxial layer having said first conductivity type disposed over said first middle epitaxial layer and under said upper epitaxial layer, said first middle epitaxial layer having a bulk resistivity above 1 ohm-cm;
   a second doped region having said first conductivity type disposed in said first middle epitaxial layer under said shallow component and over said first doped region, extending at least up to a top of said first middle epitaxial layer and at least down to a bottom of said first middle epitaxial layer, said second doped region having a bulk resistivity less than 1 ohm-cm, said deep component being disposed outside of said second doped region;
   a third doped region having said first conductivity type disposed in said second middle epitaxial layer under said shallow component and over a portion of said second doped region, extending at least up to a top of said second middle epitaxial layer and at least down to a bottom of said second middle epitaxial layer, said third doped region having a bulk resistivity less than 1 ohm-cm, said deep component being disposed outside of said second doped region; and
   an intermediate component disposed in said upper epitaxial layer and said second middle epitaxial layer above a portion of said first doped region and a portion of said second doped region, said intermediate component being disposed outside of said third doped region.

5. The integrated circuit of claim 1, wherein said shallow device is a metal oxide semiconductor (MOS) transistor.

6. The integrated circuit of claim 1, wherein said deep device is a high voltage MOS transistor.

7. The integrated circuit of claim 1, wherein said deep device is a bipolar transistor.

8. The integrated circuit of claim 1, comprising a doped well disposed in said upper epitaxial layer over a portion of said doped region, said doped well having an average doping density greater than $1 \times 10^{18}$ cm$^{-3}$, said doped well and said portion of said doped region under said doped well being part of a substrate tap structure which provides a low resistance vertical path from a top surface of said upper epitaxial layer through said doped well and said doped region to said substrate.

9. The integrated circuit of claim 1, wherein said deep device is surrounded by said doped region.

10. The integrated circuit of claim 1, wherein said first conductivity type is n-type.

11. A method of forming an integrated circuit, comprising the steps:
    providing a substrate of a first conductivity type, having a bulk resistivity less than 1 ohm-cm;

forming a lower epitaxial layer having said first conductivity type over said substrate, said lower conductivity layer having a bulk resistivity above 1 ohm-cm;

forming a doped region having said first conductivity type in said lower epitaxial layer, extending at least up to a top of said lower epitaxial layer and at least down to a bottom of said lower epitaxial layer, said doped region having a bulk resistivity less than 1 ohm-cm;

forming an upper epitaxial layer having said first conductivity type over said lower epitaxial layer, said upper conductivity layer having a bulk resistivity above 1 ohm-cm;

forming a shallow component in said upper epitaxial layer above said doped region; and forming a deep component in said upper epitaxial layer and said lower epitaxial layer, outside of said doped region.

12. The method of claim 11, wherein said doped region is a first doped region, and further comprising the steps:

forming a middle epitaxial layer having said first conductivity type over said lower epitaxial layer and under said upper epitaxial layer, said middle epitaxial layer having a bulk resistivity above 1 ohm-cm, after said step of forming said lower epitaxial layer and prior to said step of forming said upper epitaxial layer; and forming a second doped region having said first conductivity type in said middle epitaxial layer under said shallow component and over said first doped region, extending at least up to a top of said middle epitaxial layer and at least down to a bottom of said middle epitaxial layer, said second doped region having a bulk resistivity less than 1 ohm-cm, said deep component being disposed outside of said second doped region.

13. The method of claim 11, wherein said doped region is a first doped region, and further comprising:

forming a middle epitaxial layer having said first conductivity type over said lower epitaxial layer and under said upper epitaxial layer, said middle epitaxial layer having a bulk resistivity above 1 ohm-cm, after said step of forming said lower epitaxial layer and prior to said step of forming said upper epitaxial layer;

forming a second doped region having said first conductivity type in said middle epitaxial layer under said shallow component and over a portion of said first doped region, extending at least up to a top of said middle epitaxial layer and at least down to a bottom of said middle epitaxial layer, said second doped region having a bulk resistivity less than 1 ohm-cm, said deep component being disposed outside of said second doped region; and forming an intermediate component in said upper epitaxial layer and said middle epitaxial layer above a portion of said first doped region, said intermediate component being disposed outside of said second doped region.

14. The method of claim 11, wherein said doped region is a first doped region, and further comprising:

forming a first middle epitaxial layer having said first conductivity type over said lower epitaxial layer, said first middle epitaxial layer having a bulk resistivity above 1 ohm-cm, after said step of forming said lower epitaxial layer;

forming a second doped region having said first conductivity type in said first middle epitaxial layer under said shallow component and over said first doped region, extending at least up to a top of said first middle epitaxial layer and at least down to a bottom of said first middle epitaxial layer, said second doped region having a bulk resistivity less than 1 ohm-cm, said deep component being disposed outside of said second doped region;

forming a second middle epitaxial layer having said first conductivity type disposed over said first middle epitaxial layer and under said upper epitaxial layer, said first middle epitaxial layer having a bulk resistivity above 1 ohm-cm, prior to said step of forming said upper epitaxial layer;

forming a third doped region having said first conductivity type in said second middle epitaxial layer under said shallow component and over a portion of said second doped region, extending at least up to a top of said second middle epitaxial layer and at least down to a bottom of said second middle epitaxial layer, said third doped region having a bulk resistivity less than 1 ohm-cm, said deep component being disposed outside of said second doped region; and forming an intermediate component in said upper epitaxial layer and said second middle epitaxial layer above a portion of said first doped region and a portion of said second doped region, said intermediate component being disposed outside of said third doped region.

15. The method of claim 11, wherein said step of forming said doped region includes implanting dopants at a dose of $1\times10^{14}$ cm$^{-2}$ to $1\times10^{16}$ cm$^{-2}$.

16. The method of claim 11, wherein said step of forming said doped region includes performing a thermal anneal which diffuses and activates dopants of said first conductivity type in said doped region.

17. The method of claim 11, wherein said shallow device is a MOS transistor.

18. The method of claim 11, wherein said deep device is a high voltage MOS transistor.

19. The method of claim 11, wherein said deep device is a bipolar transistor.

20. The method of claim 11, wherein said first conductivity type is n-type.

* * * * *